US008440999B2

(12) United States Patent
Dimitrakopoulos et al.

(10) Patent No.: US 8,440,999 B2
(45) Date of Patent: May 14, 2013

(54) SEMICONDUCTOR CHIP WITH GRAPHENE BASED DEVICES IN AN INTERCONNECT STRUCTURE OF THE CHIP

(75) Inventors: Christos D. Dimitrakopoulos, Baldwin Place, NY (US); Guy M. Cohen, Mohegan Lake, NY (US); Stephen M. Gates, Ossining, NY (US); Alfred Grill, White Plains, NY (US); Timothy J. McArdle, Mahopac, NY (US); Chun-yung Sung, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 95 days.

(21) Appl. No.: 13/027,797

(22) Filed: Feb. 15, 2011

(65) Prior Publication Data

US 2012/0205626 A1 Aug. 16, 2012

(51) Int. Cl.
*H01L 29/78* (2006.01)
(52) U.S. Cl.
USPC ............ 257/24; 257/29; 257/347; 257/369; 257/76
(58) Field of Classification Search ............ 257/24, 257/76, 369, 29, 347
See application file for complete search history.

(56) References Cited

U.S. PATENT DOCUMENTS
2012/0181508 A1* 7/2012 Chang et al. ............... 257/29

OTHER PUBLICATIONS

Caldwell, J. D. et al., Technique for the Dry Transfer of Epitaxial Graphene onto Arbitrary Substrates, ACS Nano, 2010, pp. 1108-1114, vol. 4, No. 2.
Bae, S. et al., Roll-to-roll production of 30-inch graphene films for transparent electrodes, Nature Nanotechnology, Aug. 2010, pp. 574-578, vol. 5.

* cited by examiner

*Primary Examiner* — Dung A. Le
(74) *Attorney, Agent, or Firm* — Scully, Scott, Murphy & Presser, P.C.; Louis J. Percello, Esq.

(57) ABSTRACT

A semiconductor structure includes a first dielectric material including at least one first conductive region contained therein. The structure also includes at least one graphene containing semiconductor device located atop the first dielectric material. The at least one graphene containing semiconductor device includes a graphene layer that overlies and is in direct with the first conductive region. The structure further includes a second dielectric material covering the at least one graphene containing semiconductor device and portions of the first dielectric material. The second dielectric material includes at least one second conductive region contained therein, and the at least one second conductive region is in contact with a conductive element of the at least one graphene containing semiconductor device.

18 Claims, 5 Drawing Sheets

SEMICONDUCTOR CHIP WITH GRAPHENE BASED DEVICES IN AN INTERCONNECT STRUCTURE OF THE CHIP

BACKGROUND

The present application relates to a semiconductor structure and a method of forming the same. More particularly, the present application relates to a semiconductor structure and an electronic integrated circuit which include an interconnect structure that has at least one graphene based device within at least one of the levels of the interconnect structure. The present application also relates to methods of forming such a semiconductor structure and circuit.

Several trends presently exist in the semiconductor and electronics industry including, for example, devices are being fabricated that are smaller, faster and require less power than the previous generations of devices. One reason for these trends is that personal devices such as, for example, cellular phones and personal computing devices, are being fabricated that are smaller and more portable. In addition to being smaller and more portable, personal devices also require increased memory, more computational power and speed. In view of these ongoing trends, there is an increased demand in the industry for smaller and faster transistors used to provide the core functionality of the integrated circuits used in these devices.

Accordingly, in the semiconductor industry there is a continuing trend toward fabricating integrated circuits (ICs) with higher densities. To achieve higher densities, there has been, and continues to be, efforts toward down scaling the dimensions of the devices on semiconductor wafers generally produced from bulk silicon. These trends are pushing the current technology to its limits. In order to accomplish these trends, high densities, smaller feature sizes, smaller separations between features, and more precise feature shapes are required in integrated circuits (ICs).

Significant resources go into down scaling the dimensions of devices and increasing packing densities. For example, significant time may be required to design such down scaled transistors. Moreover, the equipment necessary to produce such devices may be expensive and/or processes related to producing such devices may have to be tightly controlled and/or be operated under specific conditions. Accordingly, there are significant costs associated with exercising quality control over semiconductor fabrication.

In view of the above, the semiconductor industry is pursuing graphene to achieve some of the aforementioned goals. Graphene, which is essentially a flat sheet of carbon atoms, is a promising material for radio frequency (RF) transistors and other electronic transistors. Typical RF transistors are made from silicon, alloys of Si, e.g., SiGe, or more expensive semiconductors such as, for example, indium phosphide (InP).

As the performance of electronic devices obtainable by reducing the dimension of the devices is reaching a limit, further value could be added to a very large scale integrated (VLSI) circuit by integrating additional functions in the interconnect of the VLSI.

SUMMARY

The present application provides a semiconductor structure and a semiconductor circuit in which a graphene containing semiconductor device is formed within at least one of the interconnect levels. Embedding graphene in the interconnect will enable, for example, the fabrication of active devices in the VLSI interconnect. The at least one interconnect level containing the graphene containing semiconductor device includes at least one dielectric material layer and at least one conductive region contained therein. The present application further provides a method of forming such a semiconductor structure and semiconductor circuit.

In one aspect of the present application, a semiconductor structure is provided that includes a first dielectric material including at least one first conductive region contained therein. The disclosed structure of the present application further includes at least one graphene containing semiconductor device located atop the first dielectric material. The at least one graphene containing semiconductor device includes a graphene layer that overlies and is in contact with the at least one first conductive region. The disclosed structure further includes a second dielectric material covering the graphene containing semiconductor device and portions of the first dielectric material. In the disclosed structure, the second dielectric material includes at least one second conductive region contained therein. The at least one second conductive region is in contact with a conductive element of the at least one graphene containing semiconductor device.

In another aspect of the present application, a semiconductor circuit is provided that includes an interconnect structure. The interconnect structure within the disclosed semiconductor circuit includes a first dielectric material including at least one first conductive region contained therein. The interconnect structure also includes at least one graphene containing semiconductor device atop the first dielectric material. The at least one graphene containing semiconductor device includes a graphene layer that overlies and is in contact with the at least one first conductive region. The interconnect structure also includes a second dielectric material covering the at least one graphene containing semiconductor device, and portions of the first dielectric material. In the disclosed interconnect structure of the semiconductor circuit, the second dielectric material includes at least one second conductive region contained therein. The at least one second conductive region is in contact with a conductive element of the at least one graphene containing semiconductor device.

In yet another aspect of the present application, a method is provided that includes providing a graphene layer onto at least an upper surface of a first dielectric material which includes at least one first conductive region contained therein. At least one semiconductor device is formed using the graphene layer as an element of the at least one semiconductor device. After forming the at least one semiconductor device, a second dielectric material is formed covering the graphene layer, the at least one semiconductor device, and portions of the first dielectric material. The second dielectric that is formed includes at least one second conductive region contained therein, and the at least one second conductive region is in contact with a conductive element of the at least one semiconductor device.

DETAILED DESCRIPTION

Figure 1:
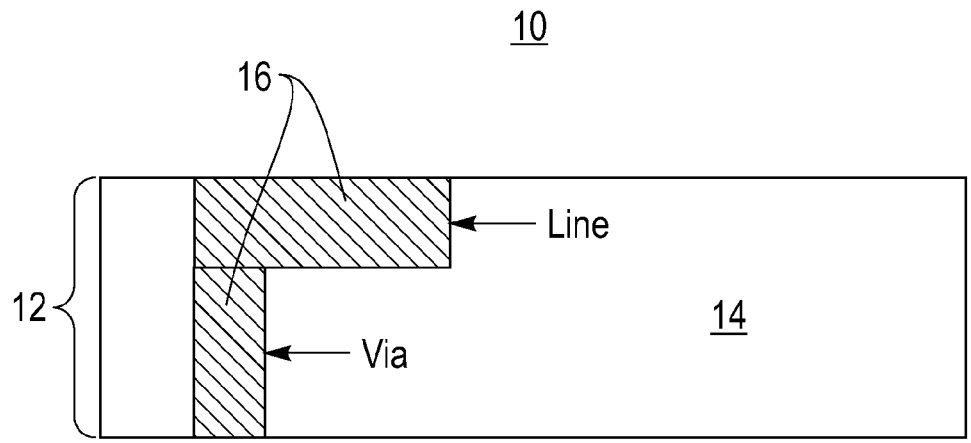
FIG. 1 is a pictorial representation (through a cross sectional view) illustrating an initial structure including a first dielectric material having at least one first conductive region contained therein that can be employed in one embodiment of the present application.

The present application, which provides a semiconductor structure and an electronic integrated circuit which include an interconnect structure that has at least one graphene based device within at least one of the levels of the interconnect structure, and methods of forming the same, will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Referring to FIG. 1, there is illustrated an initial structure 10 that can be employed in one embodiment of the present application. As illustrated, the initial structure 10, which represents an $n^{th}$ interconnect level 12 of an interconnect structure (wherein n is any integer including, for example, from 1 to 20), includes a first dielectric material 14 having at least one first conductive region 16 contained therein.

The initial structure 10 shown in FIG. 1 can be formed by first applying the first dielectric material 14 to a surface of a substrate (not shown). In one embodiment, the substrate, which is not shown, may include a semiconducting material. The semiconducting material may include any semiconductor such as Si, SiGe, SiGeC, SiC, Ge alloys, GaAs, InAs, InP and other III/V or II/VI compound semiconductors may be used. In addition to these listed types of semiconducting materials, the present application also contemplates cases in which the semiconductor substrate is a layered semiconductor such as, for example, Si/SiGe, Si/SiC, silicon-on-insulators (SOIs) or silicon germanium-on-insulators (SGOIs). When the substrate comprises a semiconducting material, one or more semiconductor devices such as, for example, complementary metal oxide semiconductor (CMOS) devices can be fabricated thereon.

In another embodiment, the substrate (not shown) includes a combination of an insulating material and a conductive material. The insulating material can be an organic insulator, an inorganic insulator or a combination thereof including multilayered stacks of such insulating materials. The conducting material may include, for example, polySi, an elemental metal, an alloy of at least two elemental metals, a metal silicide, a metal nitride or combinations thereof including multilayers.

The first dielectric material 14 can be composed of any interlevel or intralevel dielectric including inorganic dielectrics, organic dielectrics or any multilayered combination thereof. In one embodiment, the first dielectric material 14 can be porous. In another embodiment, the first dielectric material 14 can be non-porous. Some examples of suitable dielectrics that can be used as the first dielectric material 14 include, but are not limited to, $SiO_2$, silsesquioxanes, C doped oxides (i.e., organosilicates) that include atoms of Si, C, O and H (SiCOH or porous pSiCOH), SiN, SiC:H, SiCN:H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first dielectric material 14 that can be used in the initial structure 10 typically has a dielectric constant that is about 4.0 or less, with a dielectric constant of about 2.8 or less being even more typical. These dielectrics generally provide a lower parasitic crosstalk as compared with dielectric materials that have a higher dielectric constant than 4.0. The thickness of the first dielectric material 14 may vary depending upon the dielectric material used as well as the exact number of dielectrics used in forming the first dielectric material 14. Typically, the first dielectric material 14 has a thickness from 50 nm to 4500 nm. Other thickness can also be employed in the present application.

The first dielectric material 14 of the $n^{th}$ interconnect level 12 also has at least one first conductive region 16 that is embedded in (i.e., located within) the first dielectric material 14. The at least one first conductive region 16 comprises at least one conductive material that is typically, but not necessarily always, separated from the first dielectric material 14 by a barrier layer (not shown). The at least one first conductive region 16 is formed by lithography (i.e., applying a photoresist to the surface of the first dielectric material 14, exposing the photoresist to a desired pattern of radiation, and developing the exposed resist utilizing a conventional resist developer), etching (dry etching or wet etching) an opening in the first dielectric material 14 and filling the etched region with, if present the barrier layer, and then with a conductive material forming the conductive region.

The opening that is formed can include a via opening, a line opening or a combined via opening and line opening. The combined via opening and line opening may include a via opening located beneath and in direct communication with an overlying line opening. Alternatively, the combined via opening and line opening may include a line opening located beneath and in direct communication with an overlying via opening. The structure shown in FIG. 1 includes an embodiment in which a combined via opening (designated as via in the drawings) and line opening (designated as line in the drawings) is formed which includes a via opening located beneath and in direct communication with an overlying line opening. When a combined via opening and line opening is formed, a dual damascene process is typically employed in forming the combined via and line openings within the first dielectric material 14.

The barrier layer, which may comprise Ta, TaN, Ti, TiN, Ru, RuN, W, WN or any other material that can serve as a barrier to prevent conductive material from diffusing into the first dielectric material 14, is formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the barrier layer may vary depending on the technique used in forming the barrier layer as well as the type of barrier material employed. Typically, the barrier layer has a thickness from 4 nm to 40 nm, with a thickness from 7 nm to 20 nm being more typical.

The remaining region of the opening within the first dielectric material 14 is filled with a conductive material forming the at least one first conductive region 16. The conductive material used in forming the at least one first conductive region 16 includes, for example, a conductive metal, an alloy comprising at least two conductive metals, a conductive metal silicide, polySi, or combinations thereof. In one embodiment of the present application, the conductive material that is used in forming the at least one first conductive region 16 is a conductive metal such as Cu, W, Al or alloys thereof such as, for example AlCu. Typically, the at least one conductive region is filled with Cu or AlCu.

The conductive material is filled into the remaining opening in the first dielectric material 14 utilizing a conventional deposition process including, but not limited to, electroplating, CVD, PECVD, sputtering, chemical solution deposition or plating. After deposition, a planarization process such as, for example, chemical mechanical polishing (CMP) can be used to provide a structure in which the at least one first conductive region 16 has an upper surface that is substantially coplanar with the upper surface of the first dielectric material 14.

Figure 2:
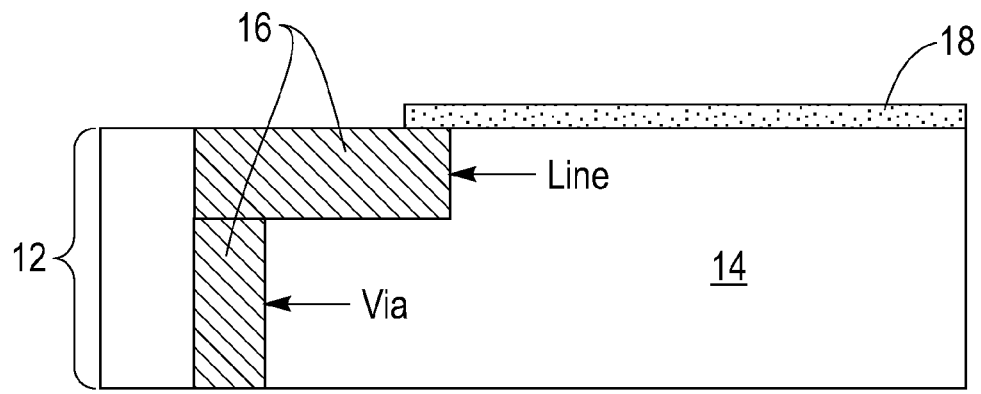
FIG. 2 is a pictorial representation (through a cross sectional view) illustrating the initial structure of FIG. 1 after transferring a graphene layer onto an upper surface thereof.

Referring to FIG. 2, there is illustrated the structure of FIG. 1, after transferring a graphene layer 18 to an upper surface of the initial structure 10 shown in FIG. 1. As is illustrated, the graphene layer 18 is located on a portion of the first dielectric material 14 and a portion thereof can extend onto an upper surface of the least one first conductive region 16.

The term "graphene" is used herein to denote a one-atom-thick planar sheet of $sp^2$-bonded carbon atoms that are densely packed in a honeycomb crystal lattice. The graphene employed as graphene layer 18 has a two-dimensional (2D) hexagonal crystallographic bonding structure. The graphene that can be employed as graphene layer 18 can be comprised of single-layer graphene (nominally 0.34 nm thick), few-layer graphene (2-10 graphene layers), multi-layer graphene (>10 graphene layers), a mixture of single-layer, few-layer, and multi-layer graphene, or any combination of graphene layers mixed with amorphous and/or disordered carbon phases. The graphene employed as graphene layer 18 can also include, if desired, substitutional, interstitial and/or intercalated dopant species as well. For example substitutional boron (B) or nitrogen (N) may be located within the graphene layer, or at the perimeter of the graphene regions.

The graphene layer 18 can be formed utilizing techniques that are well known in the art. For example, the graphene layer 18 can be first provided to a handle substrate (not shown) and then transferred to the upper surface of the initial structure 10 shown in FIG. 1 utilizing a layer transfer technique. The handle substrate can be a metallic material, a semiconductor material, or a dielectric material. In one embodiment, and if the graphene layer is formed on Cu, Ni or another like metallic handle substrate, the graphene can be transferred either by covering the graphene layer with a polymer or a thermal transfer tape, dissolving the metal, bonding the graphene layer 18 supported by the polymer onto the upper surface of the initial structure 10 and dissolving the polymer. In another embodiment, and when a layer of graphene is formed on a metallic handle substrate, the graphene layer 18 can be directly bonded to the upper surface of the initial structure 10 and then the metallic handle substrate can be dissolved.

The graphene layer 18 that is formed on the handle substrate prior to transferring to the upper surface of the initial structure 10 can be formed by mechanical exfoliation of graphite, epitaxial growth on silicon carbide, epitaxial growth on metal substrates, hydrazine reduction in which graphene oxide is placed in a suspension of pure hydrazine which reduces the graphene oxide into graphene, and sodium reduction of ethanol, i.e., by the reduction of ethanol by sodium metal, followed by pyrolysis of the ethoxide product and washing to remove sodium salts.

The thickness of the graphene layer 18 can vary depending on, for example, the technique that is employed in forming the same. In one embodiment, the graphene layer 18 typically has a thickness from 0.34 nm to 10 nm, with a thickness from 0.34 nm to 3.4 nm being more typical, and with a thickness from 0.34 nm to 1.1 nm being even more typical. Other thicknesses besides those mentioned above can also be employed.

Figure 3:
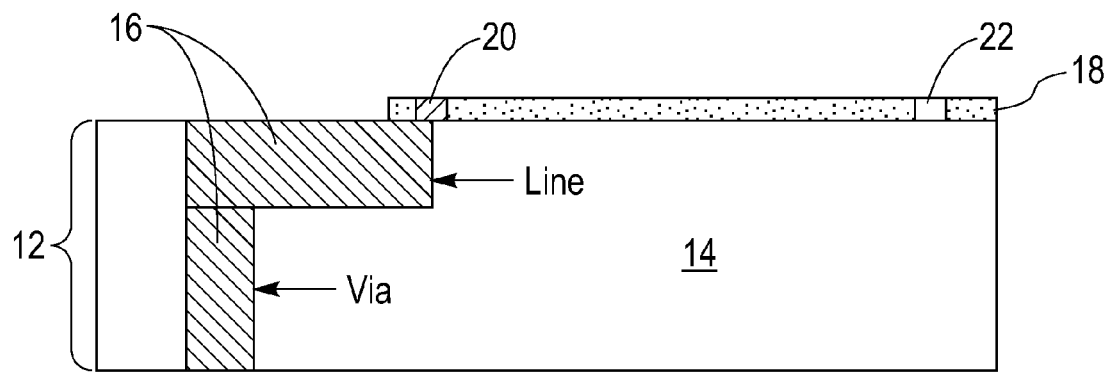
FIG. 3 is a pictorial representation (through a cross sectional view) illustrating the structure of FIG. 2 after forming a conductive filled via and a dielectric filled via within the graphene layer.

Referring to FIG. 3, there is illustrated the structure of FIG. 2 after forming a conductive filled via 20 and a dielectric filled via 22 within the graphene layer 18. Although a single conductive via 20 and a single dielectric filled via are shown, the present application can be used when a plurality of such conductive filled vias 20 and dielectric filled vias 22 are present. In some embodiments, the dielectric filled via 22 can be omitted and just a conductive filled via 20 can be formed. In other embodiments, the conductive filled via 20 can be omitted and just a dielectric filled via 22 can be formed. In yet other embodiments, no conductive filled via 20 or dielectric filled via 22 is formed into the graphene layer 18. It is observed that the conductive filled via 20 aids in adhering the graphene layer 18 to the at least one first conductive region 16, while the dielectric filled via 22 aids in adhering the graphene layer 18 to the first dielectric material 14.

When at least one conductive filled via is present, the conductive filled via 20 is formed in a portion of the graphene layer 18 and the conductive filled via 20 extends to at least an upper surface of the at least one first conductive region 16. In some embodiments, and as illustrated, a bottom surface of the conductive filed via 20 can straddle the upper surface of the at least one first conductive region 16 and the upper surface of the adjacent first dielectric material 14.

The conductive filled via 20 can be formed by lithography (including applying a photoresist to the graphene layer, exposing the photoresist to a desired pattern of radiation, and developing the exposed resist), etching (including dry etching and wet etching) a via opening into the graphene layer and filling the via opening that is present in the graphene layer 18 with a conductive material including, for example, one of the conductive materials mentioned above for the at least one first conductive region 16. The filling of the via formed into the graphene layer can include one of the processes used in filling the opening that was formed into the first dielectric material 14. After transferring the via pattern into the graphene layer, the patterned resist can be removed utilizing a conventional resist removal process such as, for example, ashing. In one embodiment of the present application, the conductive filled via 20 and the at least one first conductive region 16 comprise the same conductive material, such as, for example, Cu or AlCu. In another embodiment of the present application, the conductive filled via 20 and the at least one first conductive region 16 comprise different conductive materials.

When a least one dielectric filled via is present, the dielectric filled via 22 is formed in a portion of the graphene layer 18 and the dielectric filled via 22 extends to at least an upper surface of the first dielectric material 14. The dielectric filled via 22 can be formed by lithography (including applying a photoresist to the graphene layer, exposing the photoresist to a desired pattern of radiation, and developing the exposed resist), etching (including dry etching and wet etching) a via opening into the graphene layer and filling the via opening that is present in the graphene layer 18 with a dielectric material. The dielectric material that can be used in forming the dielectric filled via includes for example, an insulating oxide, an insulating nitride, and/or an insulating oxynitride. In one embodiment, the dielectric material that can be used in forming the dielectric filled via 22 is silicon oxide. The dielectric material can be formed into the via utilizing a deposition process such as, for example, chemical vapor deposition, and plasma enhanced chemical vapor deposition.

When both a conductive filled via 20 and a dielectric filled via 22 are present, the order of formation of the filled vias can vary and is inconsequential to the process flow of the present application. Again it is noted that a plurality of such conductive filled vias and dielectric filled vias can be formed into the graphene layer.

Figure 4:
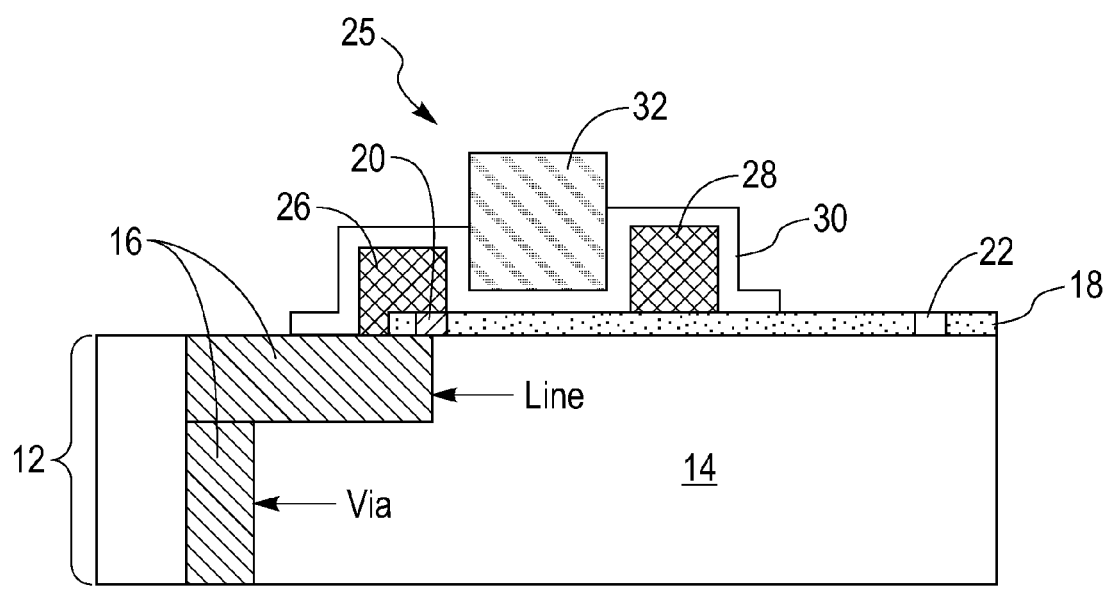
FIG. 4 is a pictorial representation (through a cross sectional view) illustrating the structure of FIG. 3 after forming at least one semiconductor device using the graphene layer as an element of the at least one semiconductor device.

Referring to FIG. 4, there is illustrated the structure of FIG. 3 after forming at least one semiconductor device 25 using the graphene layer 18 as an element of that device. Collectively, elements 25 and 18 can be referred to herein as at least one graphene containing semiconductor device.

Specifically, FIG. 4 illustrates the structure of FIG. 3 after forming at least one field effect transistor (FET) with the graphene layer 18 as the channel. Although the present application illustrates forming an FET with graphene layer 18 as the channel, the present application is not limited to just those types of semiconductor devices. Instead, other semiconductor devices including, but not limited to, diodes, and BiCMOS, can be formed using graphene layer 18. In embodiments in which no conductive filled via or dielectric filled via is formed into the graphene layer, the at least one semiconductor device 25 can be formed using graphene layer 18 shown in FIG. 2 of the present application.

As shown, the semiconductor device 25 includes a source region 26 and a drain region 28. In one embodiment, and as shown in FIG. 4, a portion of the source region 26 can be in direct contact with an upper surface of the at least one first conductive region 16, while another portion of the source region 26 can be located atop the graphene layer 18. It should be noted that the source region and the drain region can be switched such that the drain region 28 is located on the left hand side of the device, and the source region is located on the right hand side of the device. As is also shown in the drawings, portions of the source region 26 (or drain region 28 if the two are switched) can be in communication with an underlying portion of the at least one first conductive region 16 by the conductive filled via 20.

The source region 26 and the drain region 28 are conductive contacts that can be formed utilizing a conventional lift off process. Alternatively, the source region 26 and the drain region 28 can be formed by deposition, lithography and etching. The source region 26 and the drain region 28 include a conductive material such as, but not limited to, polycrystalline silicon, polycrystalline silicon germanium, an elemental metal (e.g., tungsten, titanium, tantalum, aluminum, nickel, ruthenium, palladium and platinum), an alloy including at least two of the aforementioned elemental metals, a metal nitride (e.g., tungsten nitride, aluminum nitride, and titanium nitride), a metal silicide and multilayered combinations thereof. The metal silicides or nitrides may include a single metal or more than one metal can be present.

Next, a gate dielectric layer 30 is formed atop the source region 26 and the drain region 28 and on the graphene layer 18 that is located between the source region 26 and the drain region 28; some of the gate dielectric layer 30 can also extend onto the surface of the at least one first conductive region 16. The gate dielectric layer 30 employed can include any insulating material such as for example, an organic polymer, an oxide, a nitride, an oxynitride or a multilayered stack thereof. In one embodiment, the gate dielectric layer 30 can include a semiconductor oxide, a semiconductor nitride or a semiconductor oxynitride.

In another embodiment, the gate dielectric layer 30 can include a dielectric metal oxide or mixed metal oxide having a dielectric constant that is greater than the dielectric constant of silicon oxide, i.e., 3.9. Typically, the dielectric material that can be employed as the gate dielectric layer 30 has a dielectric constant greater than 4.0, with a dielectric constant of greater than 8.0 being more typical. Such dielectric materials are referred to herein as high k dielectrics. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Multilayered stacks of these high k materials can also be employed as the gate dielectric layer 30. Each value of x is independently from 0.5 to 3 and each value of y is independently from 0 to 2.

The thickness of the gate dielectric layer 30 that can be employed may vary depending on the technique used to form the same. Typically, the gate dielectric layer 30 that can be employed has a thickness from 1 nm to 20 nm, with a thickness from 2 nm to 10 nm being more typical. In some embodiments, the gate dielectric layer 30 is a conformal layer (i.e., have a thickness variation of less than 3 Å), while in other embodiments the gate dielectric layer 30 is not conformal.

The gate dielectric layer 30 can be formed by methods well known in the art. In one embodiment, the gate dielectric layer 30 can be formed by a deposition process such as, for example, chemical vapor deposition (CVD), plasma enhanced chemical vapor deposition (PECVD), physical vapor deposition (PVD), molecular beam deposition (MBD), pulsed laser deposition (PLD), liquid source misted chemical deposition (LSMCD), and atomic layer deposition (ALD). If the gate dielectric layer 30 is a stack of several layers, some of the layers can be deposited by chemical deposition or spin-on technique.

In another embodiment, gate dielectric layer 30 does not cover the top of the source and drain regions 26, 28. Other structures are also contemplated in the present disclosure in which the gate dielectric 30 is placed between layers 32 and 18.

After forming the gate dielectric layer 30, a gate conductor 32 can be formed. The gate conductor 32 includes any conductive material including, but not limited to, polycrystalline silicon, polycrystalline silicon germanium, an elemental metal (e.g., tungsten, titanium, tantalum, aluminum, nickel, ruthenium, palladium and platinum), an alloy of at least two metals, a metal nitride (e.g., tungsten nitride, aluminum nitride, and titanium nitride), a metal silicide (e.g., tungsten silicide, nickel silicide, and titanium silicide) and multilayered combinations thereof. In one embodiment, the conductive material that can be employed as gate conductor 32 can be comprised of an nFET metal gate. In another embodiment, the conductive material that can be employed as gate conductor 32 can be comprised of a pFET metal gate. In a further embodiment, the conductive material that can be employed as gate conductor 32 can be comprised of polycrystalline silicon. The polysilicon conductive material can be used alone, or in conjunction with another conductive material such as, for example, a metal conductive material and/or a metal silicide material.

The conductive material that is employed as gate conductor 32 can be formed utilizing a conventional deposition process including, for example, chemical vapor deposition (CVD), plasma enhanced chemical vapor deposition (PECVD), physical vapor deposition (PVD), sputtering, atomic layer deposition (ALD) and other like deposition processes. When Si-containing materials are used as the conductive material, the Si-containing materials can be doped within an appropriate impurity by utilizing either an in-situ doping deposition process or by utilizing deposition, followed by a step such as ion implantation or gas phase doping in which the appropriate impurity is introduced into the Si-containing material. When a metal silicide is formed, a conventional silicidation process is employed. The as-deposited conductive material typically has a thickness from 1 nm to 100 nm, with a thickness from 3 nm to 30 nm being even more typical. Following deposition of the conductive material, the conductive material is patterned by lithography into the gate conductor 32.

In the structure shown in FIG. 4, the gate conductor 32 is separated by the source region 26 and the drain region 28 by the thickness of the gate dielectric layer 30 that is present on the sidewalls of the conductive contacts. That is, FIG. 4 shows an embodiment in which the gate conductor 32 is in direct contact with the gate dielectric layer 30 that is present on the sidewalls of the source region 26 and drain region 28. In another embodiment, the gate conductor 32 can be spaced apart laterally from the gate dielectric layer that is present on the two conductive contacts.

Also, it is observed that one edge of the conductively filled line within the first dielectric material 14 is below the source region 26 (or drain region if the two conductive contacts are switched) and does not extend into the device channel of the graphene layer that is located beneath the gate conductor 32. As such, the configuration of the structure shown in FIG. 4 has minimized parasitic capacitance associated therewith. In the illustrated structure of FIG. 4, the edge of the source region 26 (or the drain region if the two are switched) is aligned to an edge of the underlying conductive filled via 20.

Figure 5:
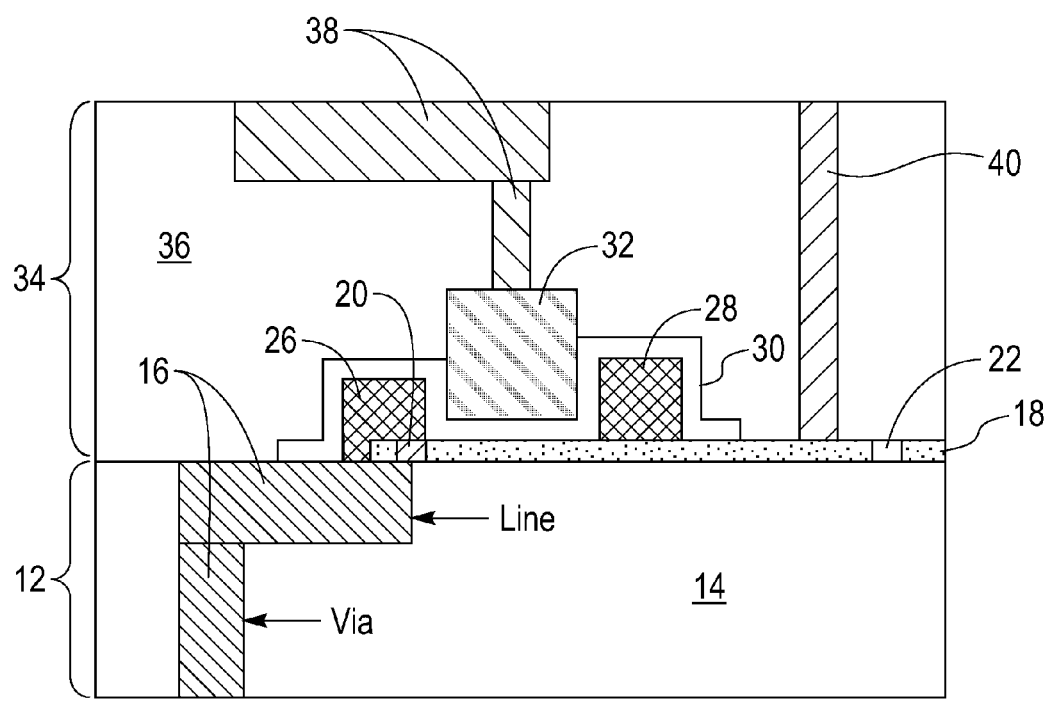
FIG. 5 is a pictorial representation (through a cross sectional view) illustrating the structure of FIG. 4 after forming a second dielectric material having at least one second conductive region contained therein.

Referring to FIG. 5, there is illustrated the structure of FIG. 4 after forming a second dielectric material 36 having at least one second conductive region 38 contained therein. As shown, a portion of the at least one second conductive region 38 is in direct contact with a conductive element, i.e., the gate conductor 32, of the at least one semiconductor device 25. In other embodiments, the at least one second conductive region 38 could contact at least one of the source/drain regions of the at least one semiconductor device 25 instead of the gate conductor 32.

Collectively, the second dielectric material 36 and the at least one second conductive region 38 can be referred to as an $n^{th}+1$ interconnect level 34. The $n^{th}+1$ interconnect level 34 can also include at least one additional wiring region 40.

The $n^{th}+1$ interconnect level 34 can be formed by applying the second dielectric material 36 to the structure shown in FIG. 4. The second dielectric material 36 can be formed utilizing one of the deposition processes used in forming the first dielectric material 14. The material of the second dielectric material 36 can be one of the dielectric materials mentioned above for the first dielectric material 14. In one embodiment, the first dielectric material 14 and the second dielectric material 36 comprise the same dielectric material. In another embodiment, the first dielectric material 14 and the second dielectric material 36 comprise different dielectric materials. The thickness of the second dielectric material 36 can be within the range mentioned above for the first dielectric material 14. In one embodiment, the first and second dielectric materials (14, 36) have the same thickness. In another embodiment, the first and second dielectric materials (14, 36) have different thicknesses.

After providing the second dielectric material 36, the second dielectric material 36 can be processed to include the at least one second conductive region 38 and the wiring region 40. As is shown, the at least one second conductive region 38 connects the graphene FET to the rest of the interconnect structure, while wiring region 40 is a part of the interconnect in $n^{th}+1$ level. The at least one second conductive region 38 and the wiring region 40 can be formed utilizing the same technique and materials as mentioned above in forming the at least one first conductive region 16 in the first dielectric material. That is, the at least one second conductive region 38 and wiring region 40 can formed by lithography (i.e., applying a photoresist to the surface of the second dielectric material 36, exposing the photoresist to a desired pattern of radiation, and developing the exposed resist utilizing a conventional resist developer), etching (dry etching or wet etching) openings in the second dielectric material 36 and filling the etched regions with, if present another barrier layer, and then with a conductive material forming the conductive region and the wiring region.

The opening that is formed for the at least one second conductive region 38 and the wiring region 40 can include a via opening, a line opening or a combined via opening and line opening. The combined via opening and line opening may include a via opening located beneath and in direct communication with an overlying line opening. Alternatively, the combined via opening and line opening may include a line opening located beneath and in direct communication with an overlying via opening. The structure shown in FIG. 5 includes an embodiment in which a combined via opening and line opening is formed which includes a via opening located beneath and in direct communication with an overlying line opening. When a combined via opening and line opening is formed a dual damascene process is typically employed in forming the combined via and line openings within the second dielectric material 36. It is observed that in the drawings, each of the lines runs parallel to an upper surface of an underlying substrate, while each via runs perpendicular to an upper surface of the underlying substrate.

The interconnect level 34 provides contact to the semiconductor device, and also may provide strong adhesive contact to the level below, 12, thus maintaining the device firmly in place, adhered to the level below.

As mentioned above, a barrier layer can be formed into each opening formed into the second dielectric material. When present, the barrier layer may comprise Ta, TaN, Ti, TiN, Ru, RuN, W, WN or any other material that can serve as a barrier to prevent conductive material from diffusing into the second dielectric material 36. If present, the barrier layer can be formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating. The thickness of the barrier layer may vary depending on the exact means of the deposition process as well as the material employed. Typically, the barrier layer has a thickness from 4 nm to 40 nm, with a thickness from 7 nm to 20 nm being more typical.

If the barrier layer is present, the barrier layer that is present atop the horizontal surface of the gate conductor 32 within the at least one second conductive region 38 and the wiring region 40 can be removed by utilizing a sputtering process such as, for example, Ar sputtering.

The remaining region of the openings within the second dielectric material 36 is filled with a conductive material forming the at least one second conductive region 38 and the at least one wiring region 40. The conductive material used in forming the at least one second conductive region 38 and the at least one wiring region 40 includes, for example, polySi, a conductive metal, an alloy comprising at least one conductive metal, a conductive metal silicide or combinations thereof. In one embodiment of the present application, the conductive material that is used in forming the at least one second conductive region 38 and the at least one wiring region 40 is a conductive metal such as Cu, W Al or alloys thereof such as, for example AlCu. Typically, the at least one conductive region is filled with Cu or AlCu. In some embodiments, the at least one second conductive region 38 and the at least one wiring region 40 can be composed of different conductive materials.

The conductive material is filled into the remaining opening in the second dielectric material 36 utilizing a conventional deposition process including, but not limited to, CVD, PECVD, sputtering, chemical solution deposition or plating. After deposition, a planarization process such as, for example, chemical mechanical polishing (CMP) can be used to provide a structure in which the at least one second conductive region 38 and the at least one wiring region 40 each have an upper surface that is substantially coplanar with the upper surface of the second dielectric material 36.

Figure 6:
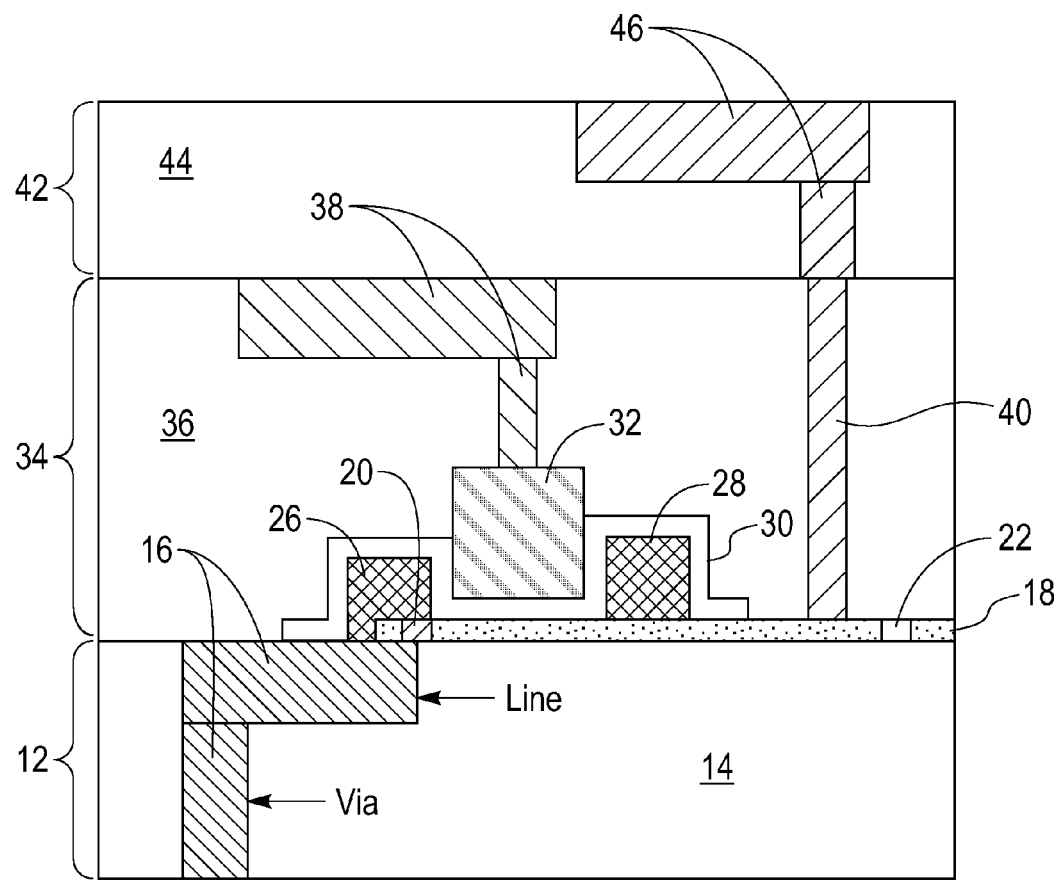
FIG. 6 is a pictorial representation (through a cross sectional view) illustrating the structure of FIG. 5 after forming a third dielectric material having at least one third conductive region contained therein.

Referring to FIG. 6, there is illustrated the structure of FIG. 5 after forming a third dielectric material 44 having at least one third conductive region 46 contained therein. The third dielectric material 44 having that at least one third conductive region 46 contained therein can also be referred to as an $n^{th}+2$ interconnect level 42. In some embodiments of the present application, the $n^{th}+2$ interconnect level 42 is not formed and the $n^{th}+1$ interconnect level 34 represents a final interconnect level of the structure.

The $n^{th}+2$ interconnect level 42 can be formed by applying the third dielectric material 44 to the structure shown in FIG. 5. The third dielectric material 44 can be formed utilizing one of the deposition processes used in forming the first dielectric material 14. The material of the third dielectric material 44 can be one of the dielectric materials mentioned above for the first dielectric material 14. In one embodiment, the first dielectric material 14, the second dielectric material 36 and the third dielectric material 44 comprise the same dielectric material. In another embodiment, the first dielectric material 14, the second dielectric material 36 and the third dielectric material 44 comprise different dielectric materials. Other combinations of dielectric materials for the various dielectric layers are contemplated herein. The thickness of the third dielectric material 44 can be within the range mentioned above for the first dielectric material 14. The thickness of the third dielectric 44 can be identical to or different from any of the dielectric materials that are located beneath the $n^{th}+2$ interconnect level 42.

After providing the third dielectric material 44, the third dielectric material 44 can be processed to include the at least one third conductive region 46 utilizing the same technique and materials as mentioned above in forming the at least one first conductive region 16 in the first dielectric material 14.

Additional interconnect levels with or without the graphene-containing device can be formed atop the structure shown in FIG. 5 or FIG. 6. Once a final interconnect level has been achieved, one or more passivation layers can be formed atop the final interconnect level. The resultant structure including the at least one or more passivation layers can then be packaged into a microelectronic chip package.

Figure 7:
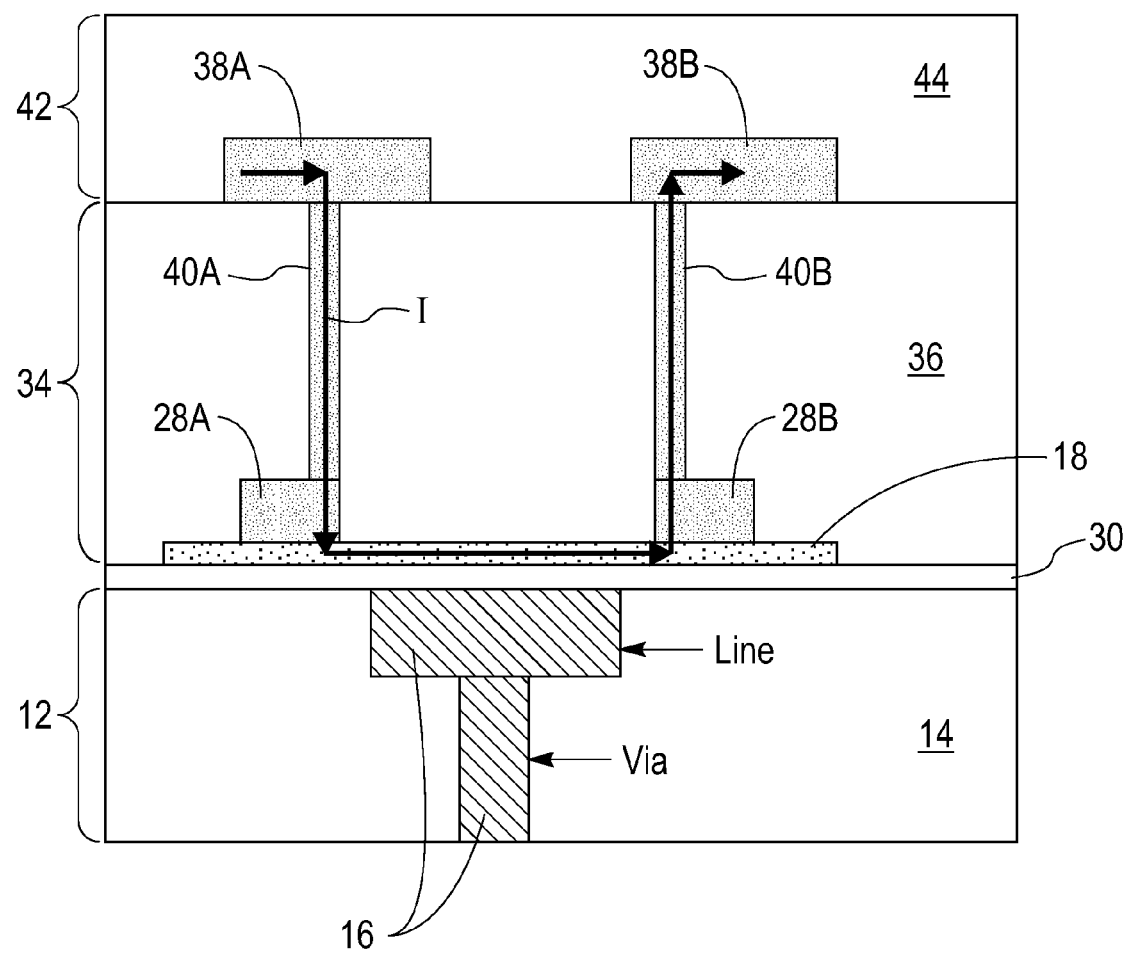
FIG. 7 is a pictorial representation (through a cross sectional view) illustrating another structure of the present disclosure in which a conductive region embedded within a dielectric material is used as a gate of a graphene based FET.

Reference is now made to FIG. 7 which illustrates another embodiment of the present application where conductive region 16 is used as the gate of a graphene based FET. In this embodiment, conductive region 16 controls (modulates) the current, I, flowing from via 40A to via 40B as illustrated by the arrows showing the current path. The process steps to fabricate the structure of FIG. 7 are described below. Referring to FIG. 1, a gate dielectric layer 30 is deposited over the surface of the interconnect level 12. Gate dielectric layer 30 covers conductive region 16. Gate dielectric layer 30 may be removed outside the region taken by conductive region 16 to reduce parasitic capacitance. The removal of gate dielectric layer 30 where not needed is done since gate dielectric layer 30 typically has a higher dielectric constant than that of dielectric 14 or 36. A graphene layer 18 is placed over gate dielectric layer 30. The placing of the graphene layer was discussed earlier with reference to FIG. 2. A source region 28A and a drain region 28B are formed over the graphene film 18. The choice of material and processing for source region 28A and drain region 28B is similar to that discussed in reference to FIG. 4. A dielectric 36 is used to planarize the wafer and metal vias 40A and 40B are made to contact the source region 28A and drain 28B. Metal lines 38A and 38B are used to contact vias 40A and 40B. The remaining processing step are similar to that describe earlier with reference to FIGS. 5 and 6.

The general field effect transistor (FET) devices described above are examples devices, and other detailed FET structures may be used within this disclosure. For example, a second gate dielectric and gate structure may be placed below the graphene layer, to form a dual gate device. Still other variations of an FET may be used within the scope of this disclosure.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor structure comprising:
   a first dielectric material including at least one first conductive region contained therein;

at least one graphene containing semiconductor device located atop said first dielectric material, wherein said at least one graphene containing semiconductor device includes a graphene layer having a bottommost surface comprising a first portion in direct physical with an uppermost surface of the first dielectric material and a second portion in direct physical contact with an uppermost surface of said at least one first conductive region; and a second dielectric material covering the at least one graphene containing semiconductor device and portions of the first dielectric material, wherein said second dielectric material includes at least one second conductive region contained therein, and wherein said at least one second conductive region is in contact with a conductive element of said at least one graphene containing semiconductor device.

2. The semiconductor structure of claim 1 further comprising at least one additional wiring region within the second dielectric material.

3. The semiconductor structure of claim 1 further comprising a conductive filled via located within said graphene layer, wherein a portion of the conductive filled via is located on an upper surface of the at least one first conductive region, and another portion thereof is located on the upper surface of the first dielectric material.

4. The semiconductor structure of claim 1 further comprising a dielectric filled via located within said graphene layer, wherein said dielectric filled via is in contact with the upper surface of the first dielectric material.

5. The semiconductor structure of claim 1 further comprising a conductive filled via located within one portion of said graphene layer and a dielectric filled via located within another portion of the graphene layer, wherein a portion of the conductive filled via is located on an upper surface of the at least one first conductive region, and another portion of the conductive filled via is located on the upper surface of the first dielectric material, and wherein said dielectric filled via is in contact with the upper surface of the first dielectric material.

6. The semiconductor structure of claim 1 further comprising at least one additional dielectric material located atop the second dielectric material, wherein said at least one additional dielectric material includes at least one additional conductive region contained therein.

7. The semiconductor structure of claim 1 wherein said first dielectric material and said second dielectric material are components of an interconnect structure of an electronic integrated circuit.

8. The semiconductor structure of claim 1 wherein said at least one graphene containing semiconductor device includes a field effect transistor.

9. The semiconductor structure of claim 1 further comprising regions of said graphene layer that are modified by substitutional elements including B or N.

10. A semiconductor circuit comprising:
an interconnect structure including a first dielectric material having at least one first conductive region contained therein;
at least one graphene containing semiconductor device located atop the first dielectric material, wherein said at least one graphene containing semiconductor device includes a graphene layer having a bottommost surface comprising a first portion in direct physical with an uppermost surface of the first dielectric material and a second portion in direct physical contact with an uppermost surface of said at least one first conductive region; and
a second dielectric material covering the at least one graphene containing semiconductor device and portions of the first dielectric material, wherein said second dielectric material includes at least one second conductive region contained therein, and wherein said at least one second conductive region is in contact with a conductive element of said at least one graphene containing semiconductor device.

11. The semiconductor circuit of claim 10 further comprising at least one additional wiring region within the second dielectric layer.

12. The semiconductor circuit of claim 10 further comprising a conductive filled via located within said graphene layer, wherein a portion of the conductive filled via is located on an upper surface of the at least one first conductive region, and another portion thereof is located on the upper surface of the first dielectric material.

13. The semiconductor circuit of claim 10 further comprising a dielectric filled via located within said graphene layer, wherein said dielectric filled via is in contact with the upper surface of the first dielectric material.

14. The semiconductor circuit of claim 10 further comprising a conductive filled via located within one portion of said graphene layer and a dielectric filled via located within another portion of the graphene layer, wherein a portion of the conductive filled via is located on an upper surface of the at least one first conductive region, and another portion of the conductive filled via is located on the upper surface of the first dielectric material, and wherein said dielectric filled via is in contact with the upper surface of the first dielectric material.

15. The semiconductor circuit of claim 10 further comprising at least one additional dielectric material located atop the second dielectric material, wherein said at least one additional dielectric material includes at least one additional conductive region contained therein.

16. The semiconductor circuit of claim 10 wherein said at least one graphene containing semiconductor device includes a field effect transistor.

17. A semiconductor circuit comprising:
an interconnect structure which comprises a first dielectric material including at least one first conductive region contained therein;
a gate dielectric layer located at least over the at least one first conductive region;
a graphene layer located at least over the gate dielectric layer;
a source region located on a first portion of an uppermost surface of the graphene layer;
a drain region located on a second portion of the uppermost surface of the graphene layer; and
a first via contact made to a topmost surface of the source region and a second via contact made to a topmost surface of the drain region, wherein the at least one first conductive region modulates the conductivity of the graphene layer between the source region and the drain region, and wherein said graphene layer, said source region, said drain region, said second via contact and said first via contact are all located within a second dielectric material.

18. The semiconductor circuit of claim 17 wherein said gate dielectric layer overlaps only with said at least one first conductive region to reduce parasitic capacitance.

* * * * *